United States Patent
Gindele et al.

(10) Patent No.: US 9,651,590 B2
(45) Date of Patent: May 16, 2017

(54) HEALTH MONITOR FOR TURBINE FLOW METER

(71) Applicant: Rosemount Inc., Shakopee, MN (US)

(72) Inventors: Greg Edward Gindele, Maple Lake, MN (US); Robert Michael Weinberger, Prior Lake, MN (US)

(73) Assignee: Rosemount Inc., Shakopee, MN (US)

( * ) Notice: Subject to any disclaimer, the term of this patent is extended or adjusted under 35 U.S.C. 154(b) by 242 days.

(21) Appl. No.: 14/669,573

(22) Filed: Mar. 26, 2015

(65) Prior Publication Data

US 2016/0282169 A1 Sep. 29, 2016

(51) Int. Cl.

| G01R 23/02 | (2006.01) |
|---|---|
| G01R 23/10 | (2006.01) |
| G01R 23/15 | (2006.01) |
| G01F 1/08 | (2006.01) |
| F01D 21/04 | (2006.01) |
| G01F 15/06 | (2006.01) |
| G01F 15/075 | (2006.01) |

(52) U.S. Cl.
CPC ......... *G01R 23/10* (2013.01); *F01D 21/045* (2013.01); *G01F 1/08* (2013.01); *G01R 23/02* (2013.01); *G01R 23/15* (2013.01); *F05D 2260/80* (2013.01); *F05D 2270/80* (2013.01); *G01F 15/06* (2013.01); *G01F 15/075* (2013.01)

(58) Field of Classification Search
CPC ........ F01D 41/00; F02D 41/18; F02D 41/182; F02D 41/185; F02D 41/22; F02D 41/228; F02D 2250/00; F02D 2250/04; F02D 2250/31; G01R 23/00; G01R 23/005; G01R 23/02; G01R 23/06; G01R 23/15; F17C 2250/0443; F17C 2250/0486; F17C 2250/0495; F17C 2250/07; F17C 2250/072

See application file for complete search history.

(56) References Cited

U.S. PATENT DOCUMENTS

| 3,196,681 A | * | 7/1965 | Estrabaud ............. F17C 13/023 |
|---|---|---|---|
| | | | 73/861.03 |
| 3,786,788 A | * | 1/1974 | Suda ...................... F02M 51/02 |
| | | | 123/483 |
| 3,898,962 A | * | 8/1975 | Honig .................. F02D 41/1482 |
| | | | 123/486 |
| 5,831,176 A | * | 11/1998 | Morgenthale ........... G01F 1/115 |
| | | | 73/861.77 |

(Continued)

FOREIGN PATENT DOCUMENTS

| GB | 1140180 A | 1/1969 |
|---|---|---|
| WO | 98/33043 A1 | 7/1998 |

OTHER PUBLICATIONS

International Search Report and Written Opinion in International application No. PCT/US2016/021299 dated Jul. 14, 2016.

*Primary Examiner* — Van Trieu
(74) *Attorney, Agent, or Firm* — Westman, Champlin & Koehler, P.A.

(57) ABSTRACT

A monitor module for a turbine flow meter includes a receiver that receives a sequence of pulses sent by the turbine flow meter. A frequency identifier identifies a frequency of the pulses in the sequence of pulses and a mean identifier identifies a mean frequency of frequencies of pulses. An alert system uses the mean frequency to determine when an alert should be issued.

20 Claims, 9 Drawing Sheets

(56) References Cited

U.S. PATENT DOCUMENTS

2014/0030092 A1  1/2014  Heinig et al.
2014/0069374 A1* 3/2014  Matthews ........... F02D 41/0087
                                                    123/350
2015/0056077 A1  2/2015  Tevs

* cited by examiner

HEALTH MONITOR FOR TURBINE FLOW METER

BACKGROUND

Embodiments described below relate to process field devices. In particular, the embodiments relate to turbine flow meters.

In process environments, turbine flow meters, such as turbine flow meter 100 shown in sectional view in FIG. 1, provide a signal indicative of the flow of a fluid through a conduit 102. A typical turbine flow meter 100 includes a housing 104 with flanges 106 and 108 that are mounted to respective conduit sections 109 and 110. Within housing 104, hanger blades, such as hanger blades 112 and 114, support a hanger hub 116 that in turn supports an upstream cone 118, a downstream cone 120 and a rotor assembly 122. Rotor assembly 122 rotates freely around hanger hub 116 and includes a plurality of blades that are driven by fluid flowing through housing 104. In some meters, each of the blades of rotor assembly 122 includes a magnetic or paramagnetic material that is capable of generating an electric field in a pick-off coil 124 as the blade passes by pick-off coil 124. In particular, each blade creates a positive going voltage followed by a negative going voltage as it passes pick-off coil 124. In other meters, the magnetic material is located on other parts of rotor assembly 122.

As the flow rate increases, the angular velocity of rotor assembly 122 increases thereby increasing the frequency of the pulses generated by pick-off coil 124. The proportionality of the frequency of the pulses to the flow rate is dependent on the blade construction including the angle of the blades relative to the flow.

The discussion above is merely provided for general background information and is not intended to be used as an aid in determining the scope of the claimed subject matter. The claimed subject matter is not limited to implementations that solve any or all disadvantages noted in the background.

SUMMARY

A monitor module for a turbine flow meter includes a receiver that receives a sequence of pulses sent by the turbine flow meter. A frequency identifier identifies a frequency of the pulses in the sequence of pulses and a mean identifier identifies a mean frequency of frequencies of pulses. An alert system uses the mean frequency to determine when an alert should be issued.

In further embodiments, a method includes receiving pulses from a turbine flow meter and determining a current frequency of the pulses. A difference between the current frequency of the pulses and a mean of frequencies of the pulses is determined and is used to determine whether to generate an alarm.

In still further embodiments, a device coupled to a turbine flow meter includes electronics for determining an average flow rate through the turbine flow meter based on pulses generated by the turbine flow meter and electronics for determining a mean frequency of frequencies of the pulses generated by the turbine flow meter. Electronics of the device also generate an alarm based in part on the mean frequency.

This Summary and the Abstract are provided to introduce a selection of concepts in a simplified form that are further described below in the Detailed Description. The Summary and the Abstract are not intended to identify key features or essential features of the claimed subject matter, nor are they intended to be used as an aid in determining the scope of the claimed subject matter.

DETAILED DESCRIPTION OF ILLUSTRATIVE EMBODIMENTS

In the embodiments described below, a health monitor is provided for monitoring the health of a turbine flow meter. The health monitor receives pulses from the turbine flow meter and determines a current frequency of those pulses. In addition, the health monitor determines a running mean of the frequencies of the turbine flow meter's pulses and preferably a running standard deviation of those frequencies relative to the mean. Using at least one of the mean frequency and the standard deviation, an alarm system in the health monitor generates an alarm when a failure occurs in the turbine flow meter. In some embodiments, thresholds are used to determine when an alarm should be triggered. In some embodiments, these thresholds are dynamically adjusted by the health monitor itself based on feedback provided to the health monitor of the true condition of the turbine flow meter.

Figure 1:
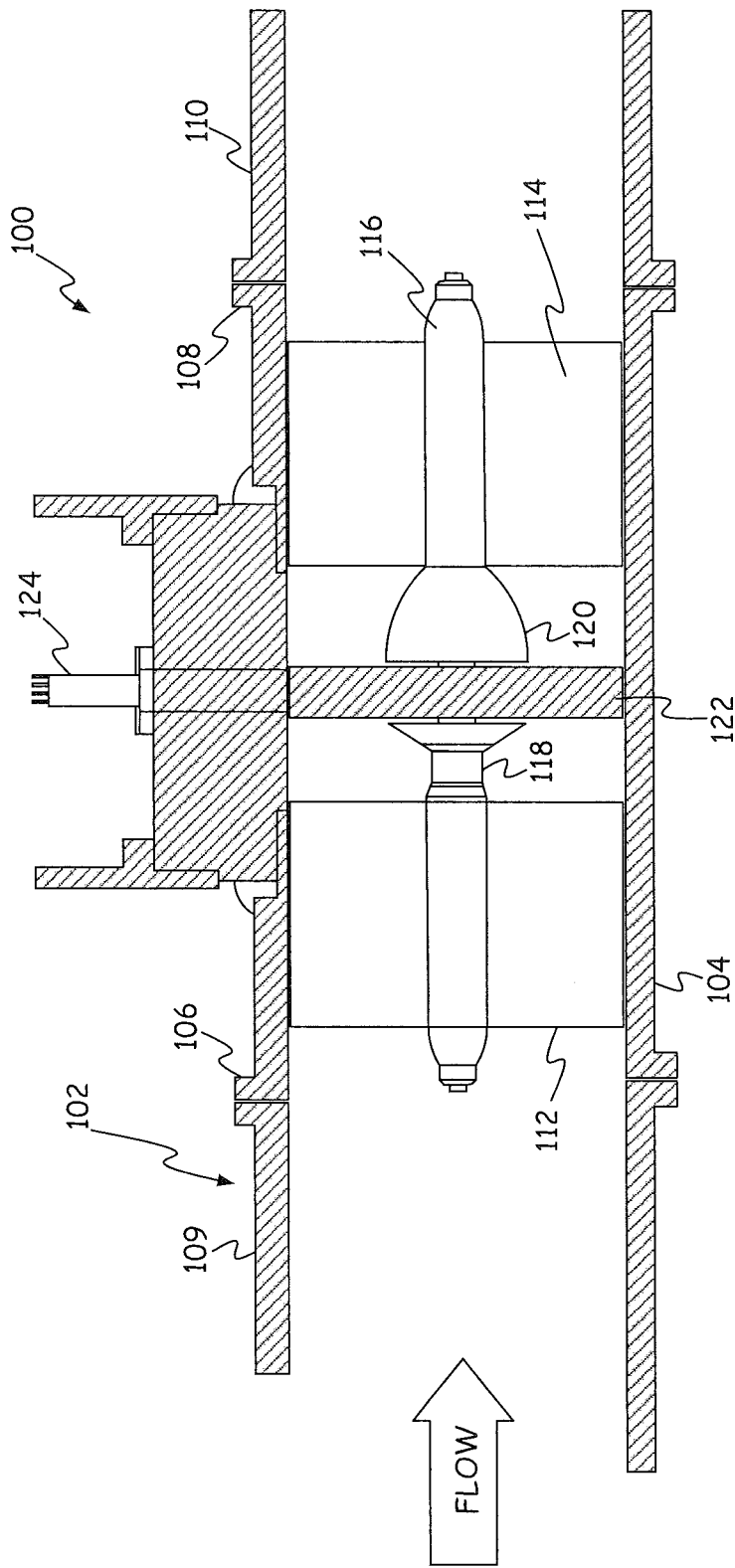
FIG. 1 is a sectional view of a prior art turbine flow meter.
Figure 2:
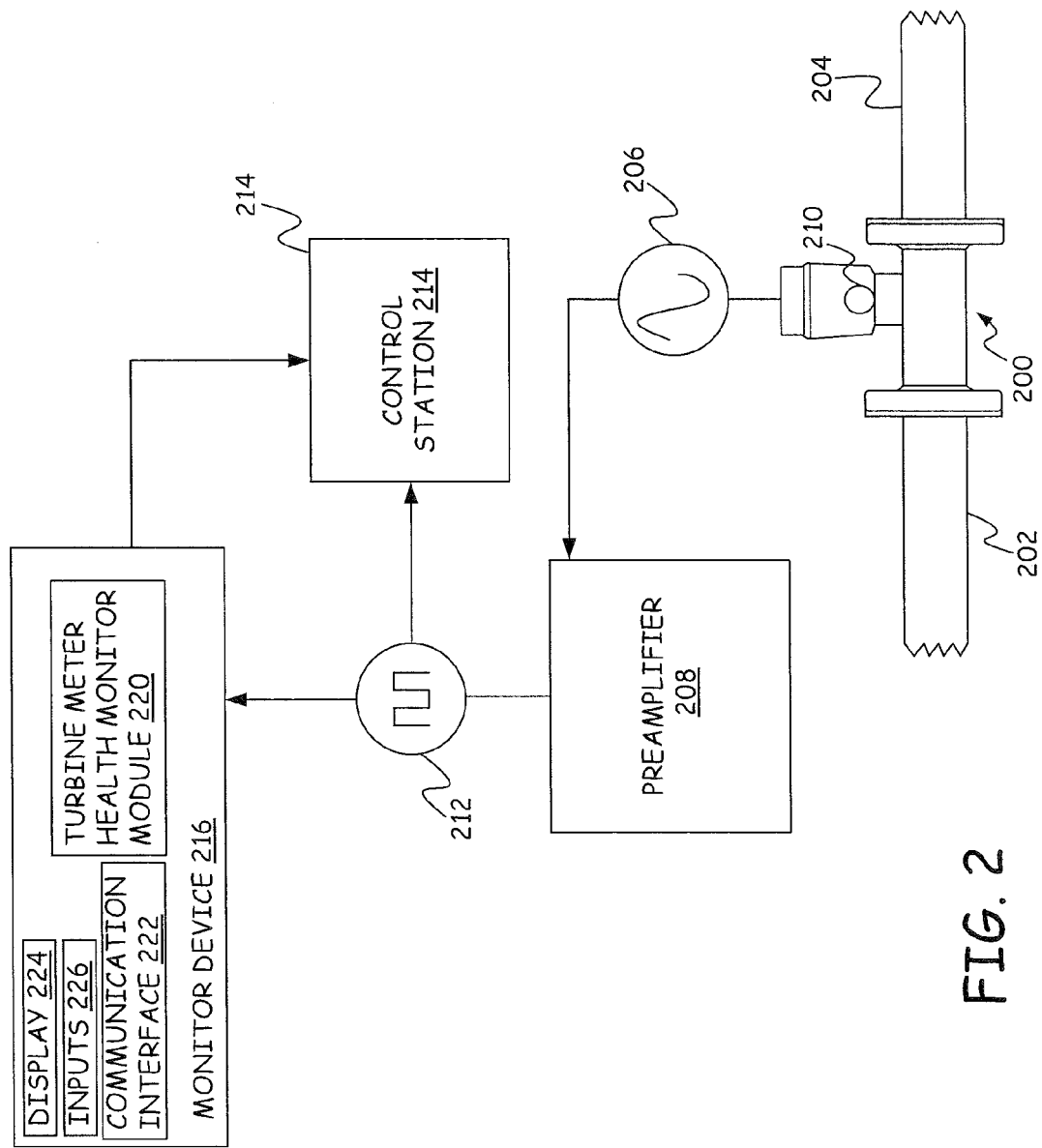
FIG. 2 is a block diagram of a process environment in accordance with one embodiment.

FIG. 2 provides a block diagram of a process environment in accordance with one embodiment. In FIG. 2, a turbine flow meter 200 is installed between two conduit sections 202 and 204 that carry a process fluid. In accordance with one embodiment, turbine flow meter 200 is a Daniel™ Series 1500 Liquid Turbine Meter from Daniel Measurement and Control, Inc. Turbine flow meter 200 generates a signal 206 consisting of a sequence of pulses that is conditioned and amplified by a preamplifier 208. In accordance with one embodiment, preamplifier 208 may be located in a local mounted enclosure (LME) 210 that is mounted on turbine flow meter 200. In accordance with some embodiments, preamplifier 208 conditions and amplifies signal 206 to form a square wave of pulses 212 from the sinusoidal-like pulses 206 produced by the pick-off coils of turbine flow meter 200. Square wave pulses 212 are provided to a control station 214, which can use the pulses to determine the average flow rate through turbine flow meter 200 and the total flow through turbine flow meter 200 over a period of time.

Square wave 212 is also provided to a monitor device 216, which includes a turbine flow meter health monitor module 220 and a communication interface 222. In various embodiments, module 220 is implemented as electronics, a combination of electronics and instructions stored in memory, or as software stored in a memory and executed by a processor. The operation of module 220 is discussed further below.

Pursuant to this embodiment, device 216 communicates with control station 214 through communication interface 222. In accordance with some embodiments, communication interface 222 is configured for wired communication over wired connections such as a two-wire loop that is used to transmit power and communications to and from device 216. Other examples of wired connections include Ethernet or optical fiber. Device 216 communicates with control station 214 using a communication protocol such as the HART® communication protocol in which digital information is modulated on a 4-20 mA current, the Foundation Fieldbus communication protocol, the Profibus communication protocol, etc. Communication interface 222 can also be connected to control station 214 through a wireless connection that utilizes a wireless communication protocol such as the WirelessHART® communication protocol in accordance with IEC 62591.

Through communication interface 222, device 216 is able to convey one or more mean frequencies, standard deviations of frequencies, current frequencies, and one or more alarms or alerts. In addition, device 216 is able to receive values from control station 214 including thresholds for triggering alarms and feedback indicating the true state of turbine flow meter 200.

In some embodiments, device 216 also includes a display 224 and input controls 226 such as buttons, keys, or touchscreens. In some embodiments, thresholds and feedback representing the true state of the turbine flow meter are provided to device 216 using inputs 226.

Figure 3:
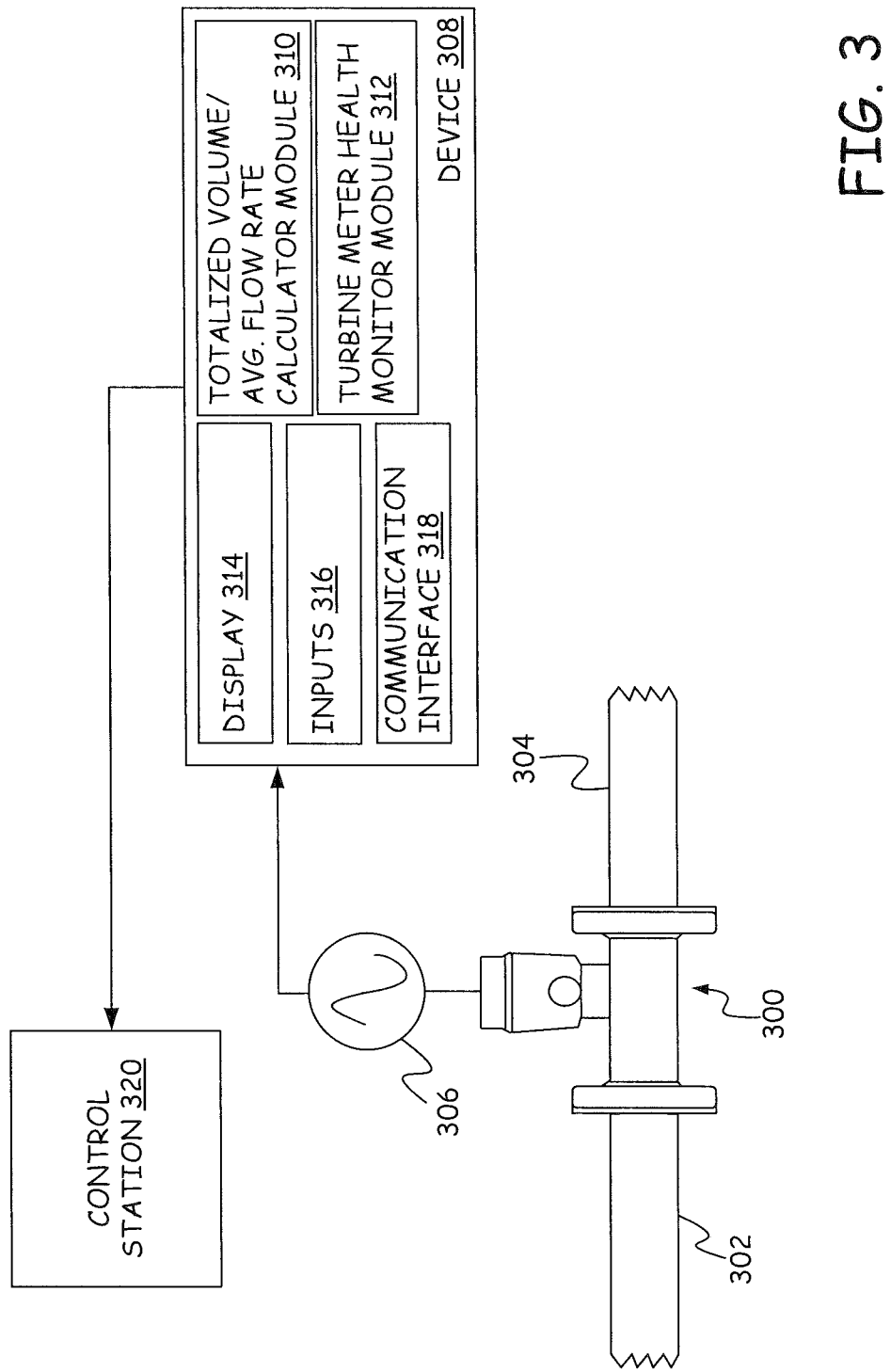
FIG. 3 is a block diagram of a process environment in accordance with a second embodiment.

FIG. 3 provides a block diagram of a process environment according to a second embodiment. In FIG. 3, a turbine flow meter 300 is connected between conduit sections 302 and 304 and includes one or more pick-off coils that produce a sinusoidal signal 306 that is provided to a device 308. In accordance with one embodiment, turbine flow meter 300 is a Daniel™ Series 1500 Liquid Turbine Meter from Daniel Measurement and Control, Inc. Device 308 includes a totalized volume/average flow rate calculator module 310 and a turbine flow meter health monitor module 312. In various embodiments, modules 310 and 312 are implemented as electronics, a combination of electronics and instructions stored in memory, or as software stored in a memory and executed by a processor. The operation of monitor module 312 is discussed further below.

Device 308 also includes a display 314 and inputs 316. Display 314 is capable of displaying a totalized volume, and an average flow rate as well as alarm indications indicating the health of the turbine flow meter. Inputs 316 can be used to adjust parameters used by totalized volume/average flow rate calculator 310 and to change thresholds used by turbine flow meter health monitor module 312.

Totalized volume/average flow rate calculator modular 310 calculates a totalized volume and an average flow rate based on pulses received from turbine flow meter 300. The volume and flow rate values may be provided in any of a plurality of units which can be selected using inputs 316. Additional parameters concerning the turbine flow meter and the fluid flowing through the turbine flow meter can also be used by totalized volume/average flow rate calculator module 310 including the K-factor and size of turbine flow meter 300.

Device 308 includes a communication interface 318. Device 308 communicates with a control station 320 through communication interface 318. In accordance with some embodiments, communication interface 318 is configured for wired communication over wired connections such as a two-wire loop that is used to transmit power and communications to and from device 308. Other examples of wired connections include Ethernet or optical fiber. Device 308 communicates with control station 320 using a communication protocol such as the HART® communication protocol in which digital information is modulated on a 4-20 mA current, the Foundation Fieldbus communication protocol, the Profibus communication protocol, etc.

Communication interface 318 can also be connected to control station 320 through a wireless connection that utilizes a wireless communication protocol such as the WirelessHART® communication protocol in accordance with IEC 62591.

Through communication interface 318, device 308 is able to convey one or more mean frequencies, standard deviations of frequencies, current frequencies, and one or more alarms or alerts. In addition, device 308 is able to receive values from control station 320 including thresholds for triggering alarms and feedback indicating the true state of turbine flow meter 300.

Figure 4:
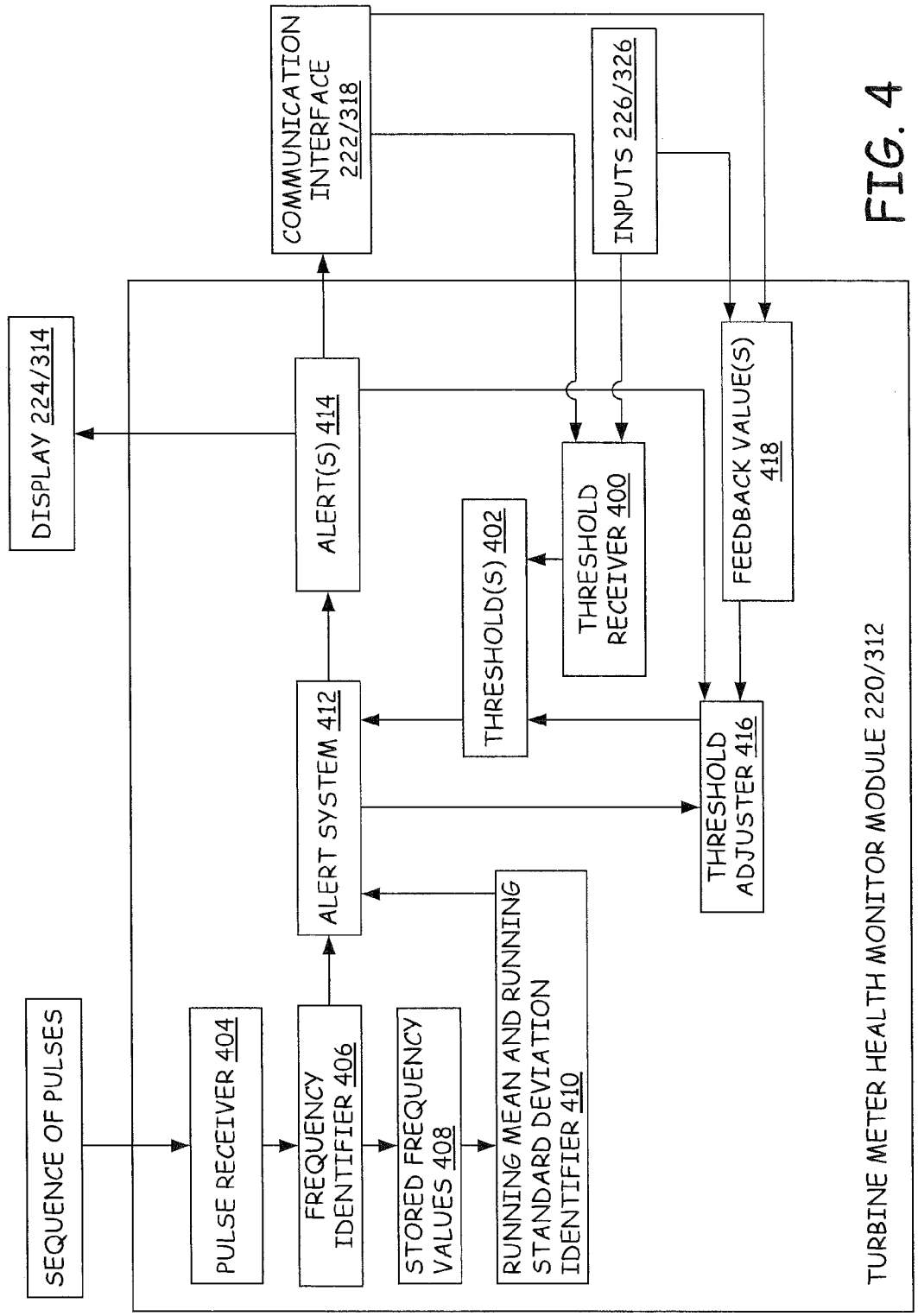
FIG. 4 is a block diagram of software and electronic components that together form a turbine flow meter health monitor in accordance with one embodiment.
Figure 5:
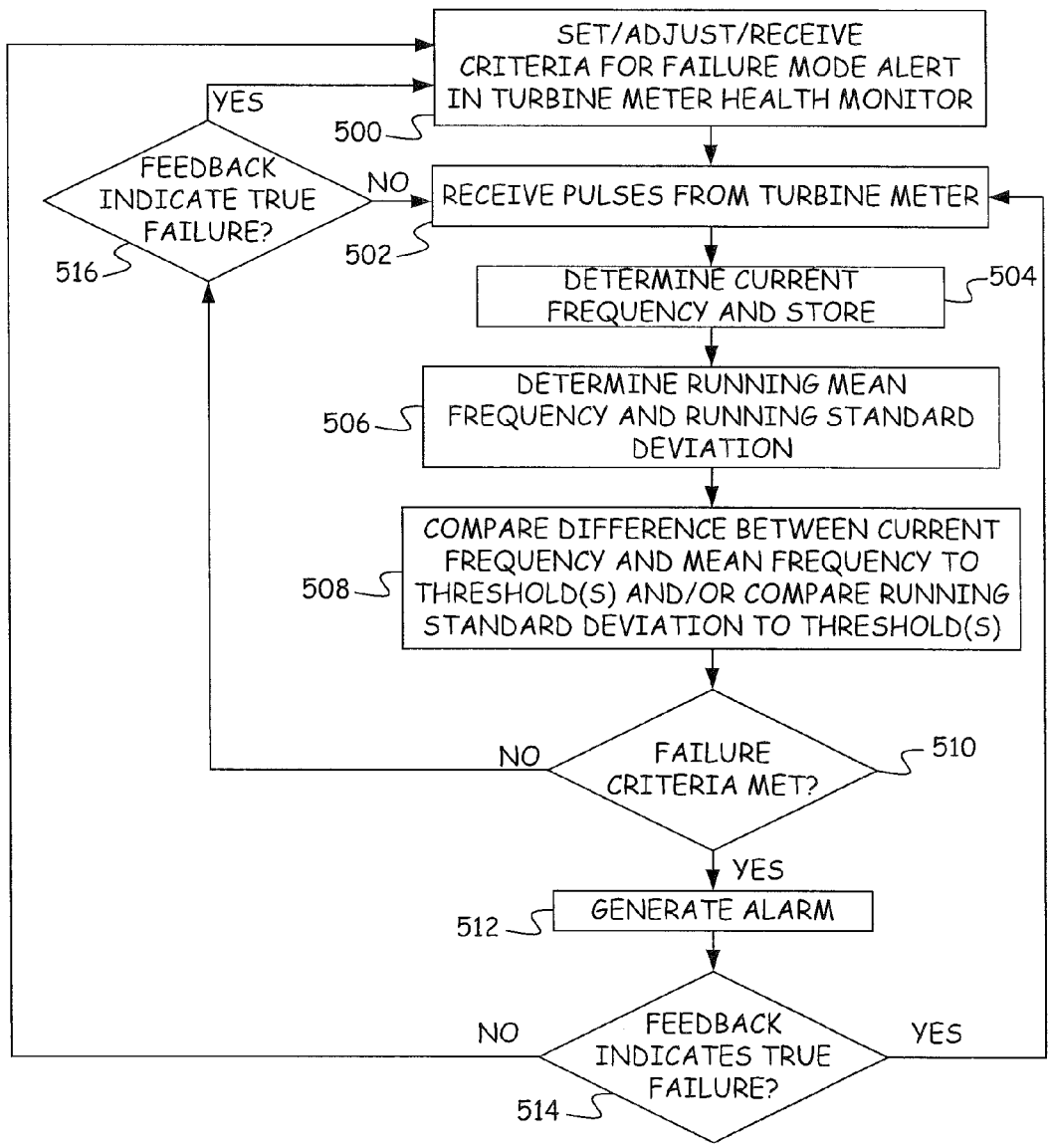
FIG. 5 is a flow diagram of a method in accordance with one embodiment.

FIG. 4 provides a block diagram of the components used by turbine flow meter health monitor modules 220/312 of FIGS. 2 and 3. The components shown in FIG. 4 may be implemented as electronics, software, or a combination of electronics and software. FIG. 5 provides a flow diagram of a method of generating alarms and adjusting alarm thresholds using the components of FIG. 4.

In step 500 of FIG. 5, criteria for one or more failure alerts is set in monitor module 220/312. The criteria are received by a threshold receiver 400 either through communication interface 222/318 or through inputs 226/316. The criteria for the failure modes are stored as thresholds 402, in accordance with one embodiment. Multiple different thresholds may be provided, each representing a separate criterion for a failure mode. For example, one criterion may be a threshold difference between a current frequency of pulses and a running mean frequency of the pulses. Another criterion may be a standard deviation threshold representing the size of a running standard deviation in the frequencies of pulses that will trigger an alert. In some embodiments, a single failure mode, such as a broken blade, may have multiple criteria set in thresholds 402.

At step 502, a pulse receiver 404 receives a sequence of pulses from the turbine flow meter. At step 504, a frequency identifier 406 determines a current frequency and stores the current frequency as part of a collection of stored frequency values 408. In accordance with one embodiment, frequency identifier 406 determines the current frequency by dividing the number of pulses that were received during a set period of time by the length of the set period of time. At step 506, a running mean and running standard deviation identifier 410 determines a running mean frequency and a running standard deviation of frequencies using stored frequency values 408. In particular, the running mean frequency is determined by determining the mean of a collection of the latest stored frequency values 408. In accordance with one embodiment, the last one hundred stored frequency values are used to form the running mean, for example. Those skilled in the art will recognize that "one hundred" is just an example number and other numbers of stored frequency values may be used in other embodiments. After the running mean has been determined, the same values used to construct the running mean are used together with the running mean to form a running standard deviation. In accordance with one embodiment, the running standard deviation is found by taking the square root of the average of the squared differences of the individual frequency values used to form the running mean frequency and the running mean frequency itself. Note that steps 504 and 506 are performed in the frequency domain and not the time domain.

At step 508, an alert system 412 determines a difference between a current frequency value provided by frequency identifier 406 and the running mean frequency. Alert system 412 then compares this difference to one or more of the thresholds 402 to determine if the difference exceeds a threshold. If the difference exceeds one or more of the thresholds at step 510, alert system 412 issues one or more alerts 414 at step 512. These alerts can be shown on display 224/314 and/or sent through communication interface 222/318 to a control station 214/320. In further embodiments, alert system 412 also compares the running standard deviation provided by running standard deviation identifier 410 to a threshold standard deviation in thresholds 402 at step 508. If the running standard deviation exceeds the threshold at step 510, alert system 412 issues an alert 414 at step 512 that can be shown on display 224/314 and/or sent through communication interface 222/318 to control station 214/320.

At step 514, a threshold adjustor 416 uses feedback values 418 provided by communication interface 222/318 or inputs 226/316 to determine if the turbine flow meter experienced a true failure. In accordance with one embodiment, feedback value(s) 418 is a Boolean value indicating failure or no failure. Feedback value(s) 418 may be provided through control station 214/320 or through inputs 226/316 after a physical inspection of the turbine flow meter or after inspection of other meter readouts that either indicate that the failure is real or that indicate that the failure is not real.

At step 514, if the feedback values 418 indicate a true failure, the process returns to step 502 and new pulses are received from the turbine flow meter. However, if feedback values 418 indicate that there was no failure in the turbine flow meter, the alarm generated at step 512 was generated in error. In response, a threshold adjuster 416 adjusts the threshold at step 500 to make the generation of a false alarm less likely. For example, threshold adjuster 416 can increase the threshold to reduce the likelihood of a false alarm.

When the failure criteria are not met at step 510, alert system 412 calls threshold adjuster 416, which examines feedback values 418 to determine if they indicate that the turbine flow meter has in fact incurred a true failure. If the turbine flow meter has incurred a true failure, threshold adjuster 416 adjusts thresholds 402 at step 500 to make it more likely that an alarm will be generated when a true failure occurs. For example, threshold adjuster 416 can reduce a threshold 402 to make it more likely that an alarm will be generated when a true failure occurs. If feedback values 418 do not indicate that a true failure occurred at step 516, or if the feedback values indicate that a true failure did occur at step 514, the process returns to step 502 and new pulses are received. Steps 502-514 are then repeated.

Figure 6:
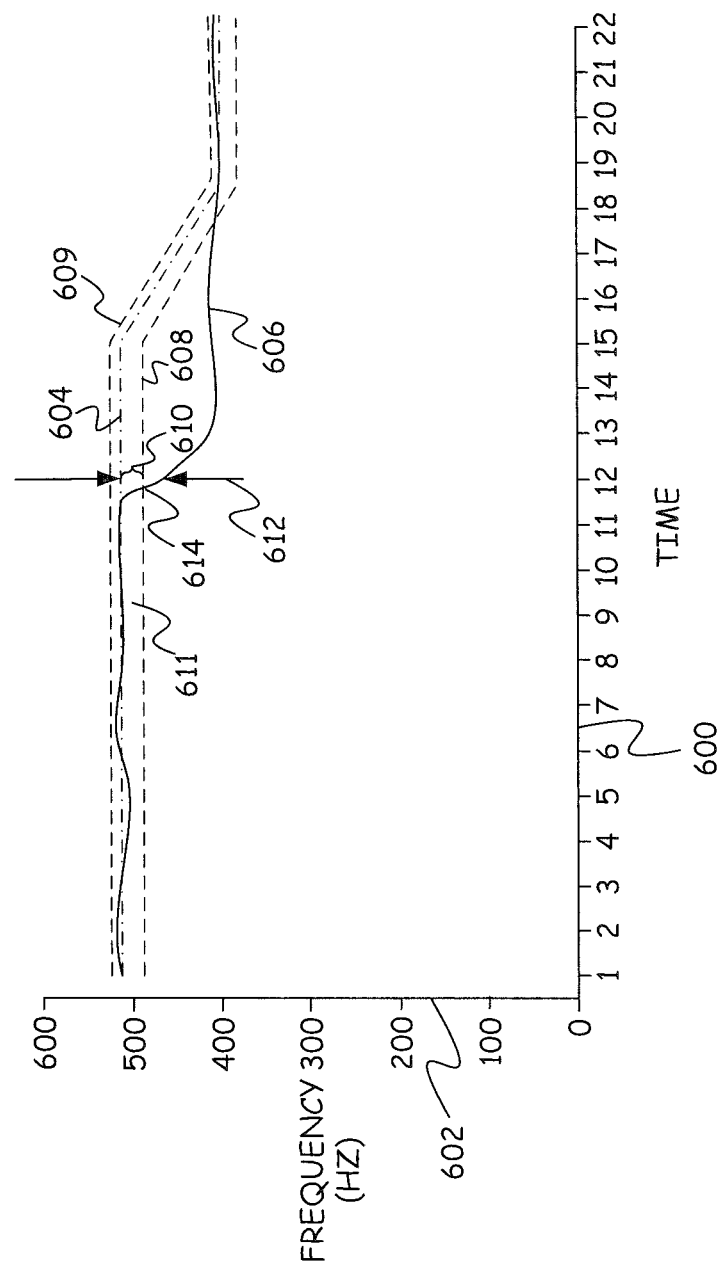
FIG. 6 is a graph of a current frequency of pulses for a broken blade failure.

FIG. 6 provides a graph of a running mean frequency 604 and a current frequency 606 for a broken blade failure in a turbine flow meter. In FIG. 6, time is shown along horizontal axis 600 and frequency of pulses is shown along vertical axis 602. The thresholds for issuing an alert are shown as alert guard bands 608 and 609, which together define a guard banding zone 611. An edge of alert guard band 608 is separated from running mean frequency 604 by a threshold amount 610. When the difference 612 between the current frequency and the running mean frequency 604 exceeds threshold 610, such as at point 614 in FIG. 6, an alert is issued. An edge of alert guard band 609 is separated from running mean frequency 604 by a separate threshold amount that may be the same as or different from threshold amount 610. Both threshold amounts may be set through threshold receiver 400 and threshold adjuster 416. In some embodiments, the threshold amounts and thus the sizes of alert guard bands 608 and 609 may vary as a function of the running mean frequency 604 such that the alert guard bands shrink as running mean frequency 604 decreases.

Figure 7:
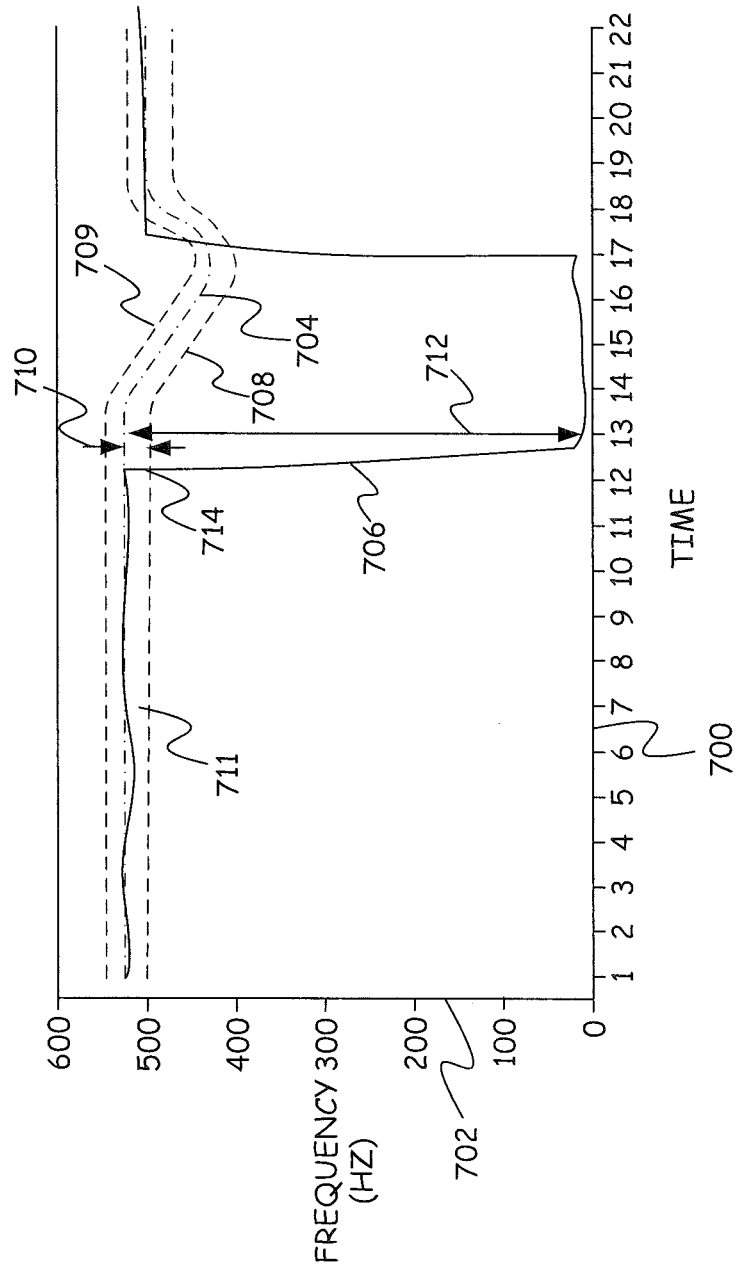
FIG. 7 is a graph of a current frequency of pulses for a debris/blockage failure.

FIG. 7 provides a graph of a running mean frequency 704 and a current frequency 706 for a turbine flow meter debris/blockage failure. In FIG. 7, time is shown along horizontal axis 700 and the frequency of pulses is shown along vertical axis 702. Alert guard bands 708 and 709 respectively extend below and above running mean frequency 704 to define a guard banding zone 711. An edge of alert guard band 708 is separated from the running mean frequency 704 by an alert threshold amount 710. When the difference 712 between current frequency 706 and running mean frequency 704 exceeds threshold 710, such as at point 714, a debris/blockage alarm is issued. An edge of alert guard band 709 is separated from running mean frequency 704 by a separate threshold amount that may be the same as or different from threshold amount 710. Both threshold amounts may be set through threshold receiver 400 and threshold adjuster 416. In some embodiments, the threshold amounts and thus the sizes of alert guard bands 708 and 709 may vary as a function of the running mean frequency 704 such that the alert guard bands shrink as running mean frequency 704 decreases.

Figure 8:
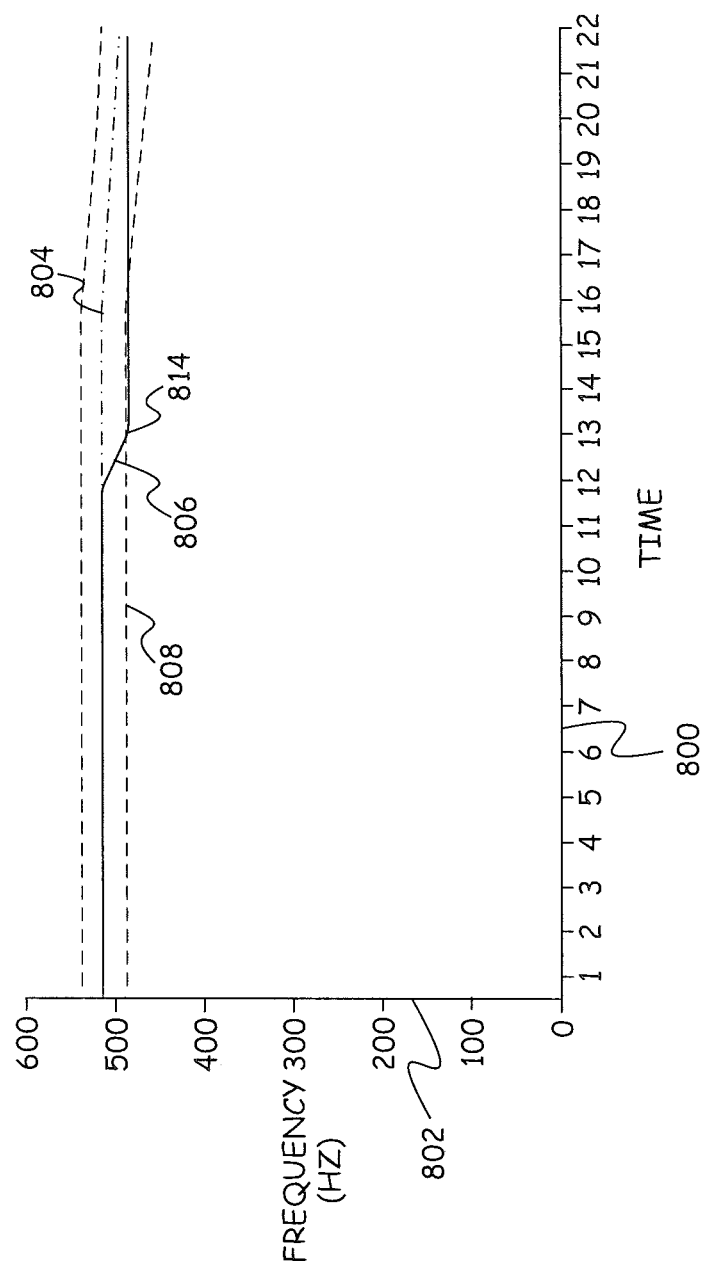
FIG. 8 is a graph of a current frequency of pulses for a mechanical wear failure.

FIG. 8 provides a graph showing a running mean frequency 804 and a current frequency 806 resulting from turbine flow meter mechanical wear. In FIG. 8, time is shown along horizontal axis 800 and the frequency of pulses is shown along vertical axis 802. At point 814, the current frequency 806 crosses an edge of alert guard band 808 such that the difference between the current frequency 806 and the running mean frequency 804 exceeds the alert threshold represented by alert guard band 808. As such, at time point 814, an alert would be issued indicating mechanical wear of the turbine flow meter.

Figure 9:
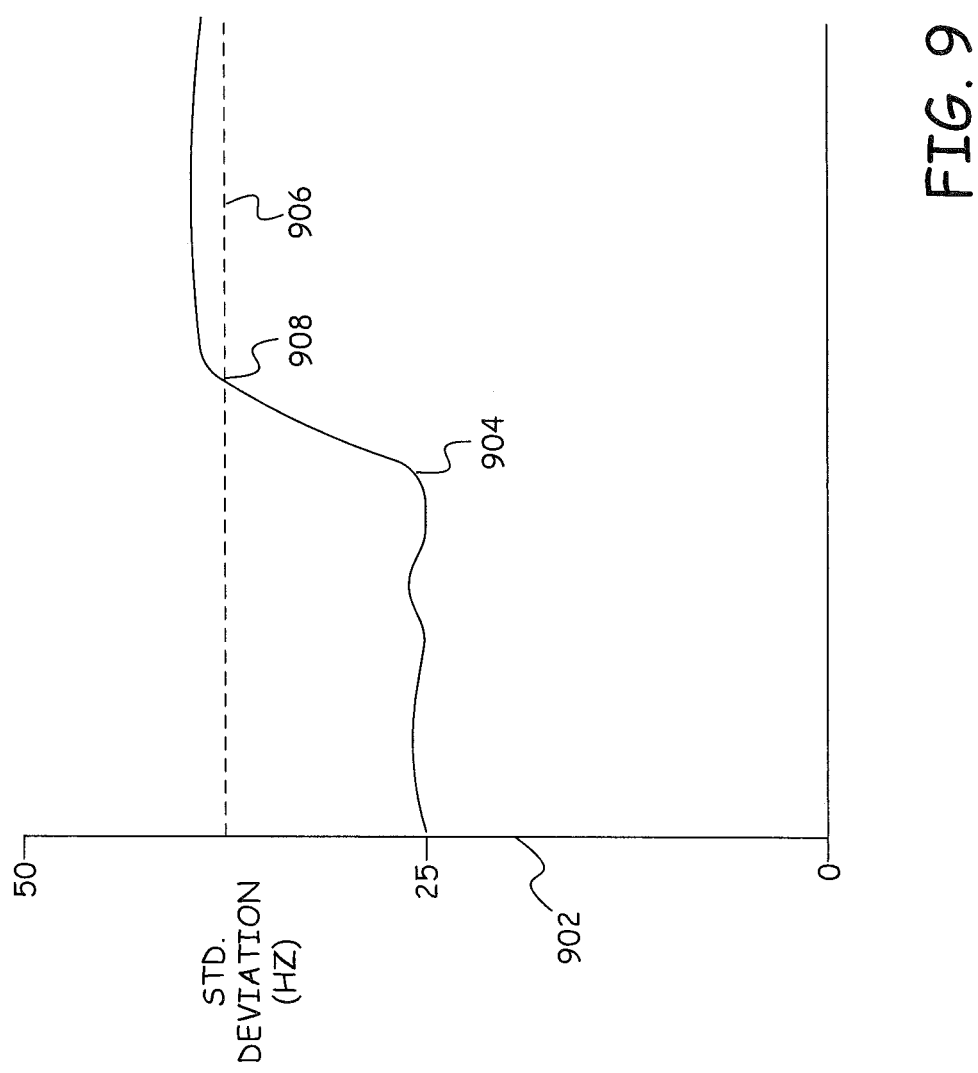
FIG. 9 is a graph of a running standard deviation and a standard deviation threshold for a broken blade failure.

FIG. 9 provides a graph showing a running standard deviation 904 and a standard deviation threshold 906 for a turbine flow meter broken blade failure. In FIG. 9, time is shown along horizontal axis 900 and standard deviations are shown along vertical axis 902. During a turbine flow meter broken blade failure, running standard deviation 904 begins to rise and at point 908 exceeds the standard deviation threshold 906. As a result, at time 908, an alert would be issued indicating a turbine flow meter broken blade failure.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms for implementing the claims.

What is claimed is:

1. A monitor module for a turbine flow meter, the monitor module comprising:
   a receiver that receives a sequence of pulses sent by the turbine flow meter;
   a frequency identifier that identifies frequencies of the pulses in the sequence of pulses;

a mean identifier that identifies a mean frequency of the frequencies of pulses; and an alert system that uses the mean frequency to determine when an alert should be issued.

2. The monitor module of claim 1 wherein the frequency identifier further identifies a current frequency of pulses and the alert system determines that an alert should be issued by determining that a difference between the current frequency of pulses and the mean frequency is greater than a threshold.

3. The monitor module of claim 1 further comprising a standard deviation identifier that determines a standard deviation of the frequencies of pulses and wherein the alert system determines that an alert should be issued by determining that the standard deviation exceeds a threshold.

4. The monitor module of claim 1 wherein the alert system determines when an alert indicating a possible broken blade in the turbine flow meter should be issued.

5. The monitor module of claim 1 wherein the alert system determines when an alert indicating debris blockage in the turbine flow meter should be issued.

6. The monitor module of claim 1 wherein the alert system determines when an alert indicating mechanical wear of the turbine flow meter should be issued.

7. The monitor module of claim 1 wherein the alert system uses at least one threshold to determine when an alert should be issued and wherein the monitor module further comprises a threshold receiver that receives a new threshold value.

8. The monitor module of claim 1 wherein the alert system uses at least one threshold to determine when an alert should be issued and wherein the monitor module further comprises a threshold adjuster that adjusts a threshold value based on at least one feedback value.

9. The monitor module of claim 8 wherein the threshold adjuster decreases the threshold value when the feedback value indicates that a failure was present in the turbine flow meter.

10. The monitor module of claim 8 wherein the threshold adjuster increases the threshold value when the feedback value indicates that a failure was not present in the turbine flow meter.

11. The monitor module of claim 1 wherein the alarm system issues the alert through a wireless communication interface.

12. The monitor module of claim 1 wherein the monitor module is housed in a device that also computes at least one of totalized volume and average flow rate from the sequence of pulses.

13. The monitor module of claim 1 wherein the monitor module is housed separately from a device that computes at least one of totalized volume and average flow rate from the sequence of pulses.

14. A method comprising:
receiving pulses from a turbine flow meter;
determining a current frequency of the pulses;
determining a difference between the current frequency of the pulses and a mean frequency of the pulses; and
determining whether to generate an alarm based on the difference between the current frequency of the pulses and the mean frequency of the pulses.

15. The method of claim 14 wherein determining whether to generate an alarm comprises determining whether the difference exceeds a threshold.

16. The method of claim 15 further comprising adjusting the threshold based on at least one feedback signal.

17. The method of claim 14 wherein determining whether to generate an alarm further comprises determining a standard deviation of the frequencies of the pulses and determining whether the standard deviation exceeds a threshold.

18. A device coupled to a turbine flow meter, the device comprising:
electronics for determining an average flow rate through the turbine flow meter based on pulses generated by the turbine flow meter;
electronics for determining a mean frequency of frequencies of the pulses generated by the turbine flow meter; and
electronics for generating an alarm based in part on the mean frequency.

19. The device of claim 18 wherein the electronics for generating an alarm determine a current frequency for the pulses generated by the turbine flow meter, compare the current frequency to the mean frequency to generate a difference, and determine if the difference exceeds an alarm threshold.

20. The device of claim 19 further comprising electronics for determining a standard deviation wherein the electronics for generating an alarm further comprises electronics for generating an alarm based on the standard deviation.

* * * * *